(12) United States Patent
Franklin et al.

(10) Patent No.: US 7,781,311 B2
(45) Date of Patent: Aug. 24, 2010

(54) SYSTEM AND METHOD FOR FILLING VIAS

(75) Inventors: Mark Andrew Franklin, Plano, TX (US); Georgina Marie Jabbour, Dallas, TX (US); James Carl Baker, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 681 days.

(21) Appl. No.: 11/642,904

(22) Filed: Dec. 20, 2006

(65) Prior Publication Data
US 2008/0150150 A1 Jun. 26, 2008

(51) Int. Cl.
*H01L 21/44* (2006.01)

(52) U.S. Cl. .............. 438/471; 438/947; 257/E21.487; 430/5

(58) Field of Classification Search ............ 438/671, 438/932; 257/E21.487
See application file for complete search history.

(56) References Cited

U.S. PATENT DOCUMENTS

| | | | |
|---|---|---|---|
| 4,489,481 A | 12/1984 | Jones | |
| 5,269,880 A | 12/1993 | Jolly et al. | |
| 6,171,964 B1 | 1/2001 | Gonzalez et al. | |
| 6,943,442 B2 | 9/2005 | Sunohara et al. | |
| 7,310,175 B2 * | 12/2007 | Monroe et al. | 359/225.1 |
| 2003/0178635 A1 * | 9/2003 | Volant et al. | 257/108 |

* cited by examiner

*Primary Examiner*—W. David Coleman
(74) *Attorney, Agent, or Firm*—Charles A. Brill; Wade James Brady, III; Frederick J. Telecky, Jr.

(57) ABSTRACT

System and method for filling vias in integrated circuits A preferred embodiment comprises forming a spacer layer on a substrate, forming a via with walls and a bottom in the spacer layer, depositing a conformal conductive layer on the spacer layer and on the walls and bottom of the via, spinning-on a photo-definable material on the conductive layer, forming a fill layer on the conductive layer and filling the via, exposing portions of the fill layer to an exposing light using a photomask, developing the fill layer to remove select portions of the fill layer and leave a portion of the fill layer filling the via, and removing the spacer layer. The use of a spin-on photo-definable material increases the material's filling and planarizing capabilities, while enabling a reduction in the number of process steps, which may reduce the likelihood of manufacturing defects, thereby increasing manufacturing yield.

19 Claims, 4 Drawing Sheets

SYSTEM AND METHOD FOR FILLING VIAS

TECHNICAL FIELD

The present invention relates generally to a system and a method for integrated circuits, and more particularly to a system and a method for filling vias in integrated circuits.

BACKGROUND

A via, a plated hole etched in one or more layers of an integrated circuit and used to provide a vertical connection between different layers, may be used for many different purposes. A via may provide electrical connectivity between different layers of the integrated circuit. Additionally, in a micro-electro-mechanical system (MEMS) a via may provide mechanical connectivity between structures in the integrated circuit. A via may also be used to provide both electrical and mechanical connectivity.

In a digital micromirror device (DMD) based projection display system, wherein a large number of micromirrors pivot along an axis based on image data from an image being displayed, a via may be used to provide electrical connectivity between distant conductive layers and conductors. Additionally, a via may be used to create a support member for each micromirror, physically attaching the micromirror to a hinge.

An electrically conductive via may be created by first etching a hole in at least one layer of an integrated circuit and then coating the walls of the hole with a metallic material, such as aluminum, tungsten, copper, and so forth, or another conductive material, such as polysilicon, using a directional (anisotropic) deposition technique, such as evaporation or sputtering, or a non-directional (isotropic) deposition technique, such as chemical vapor deposition. The directional and non-directional deposition techniques may produce vias that are adequate for use in providing electrical connectivity. Non-electrically conductive vias may also be created using the same techniques and materials, however, these techniques may not provide adequate mechanical strength to provide long-term reliability.

A technique used to help strengthen the via as well as increase its electrical and mechanical conductivity is to taper the walls of the via, such as disclosed in U.S. Pat. No. 5,269,880, entitled "Tapering Sidewalls of Via Holes," which is incorporated herein by reference. The tapered via walls permit better step coverage using the directional and non-directional deposition techniques. A disadvantage of the disclosed technique is the requirement of additional process steps to protect the bottom of the opening with a protective layer prior to the sputtering or etching, and then removing the protective layer after the sputtering or etching.

Another technique used to help strengthen the via involves the use of a spacer within the via. The spacer does not require the use of a protective layer that will need to be subsequently removed, thereby reducing the complexity of the manufacturing of the integrated circuit. U.S. Pat. No. 4,489,481, entitled "Insulator and Metallization Method for VLSI Devices with Anisotropically-Etched Contact Holes," which is incorporated herein by reference, discloses an example of such a technique with spacers created from an oxide material. U.S. Pat. No. 6,171,964, entitled "Method for Forming a Conductive Spacer in a Via," which is incorporated herein by reference, discloses an example of such a technique with spacers formed using metallic materials.

SUMMARY OF THE INVENTION

These and other problems are generally solved or circumvented, and technical advantages are generally achieved, by embodiments of the present invention which provide a system and a method for filling vias in integrated circuits.

In accordance with an embodiment, a method for forming a semiconductor device is provided. The method includes forming a spacer layer on a substrate, forming a via having walls and a bottom in the spacer layer, and depositing a conformal conductive layer on the spacer layer and on the walls and bottom of the via. The method further includes spinning-on a photo-definable material on the conductive layer, forming a fill layer on the conductive layer and filling the via. The method also includes exposing portions of the fill layer to an exposing light using a photomask, developing the fill layer to remove select portions of the fill layer and leave a portion of the fill layer filling the via, and removing the spacer layer.

In accordance with another embodiment, a semiconductor device is provided. The semiconductor device includes a first conductive layer disposed above a substrate, a set of first conductive supports disposed on the first layer, and a second conductive layer disposed on the first supports above the first layer. Each of the first supports comprises a circumferential pillar of conductive material and a fill layer of photo-definable dielectric material filling an inside of the pillar, and portions of the second layer not overlying the first supports are separated from the first layer by a vacuum or a gas.

In accordance with another embodiment, a method for fabricating a semiconductor device is provided. The method includes forming a first layer over a substrate, depositing a first spacer layer on the first layer, and creating a first opening in the first spacer layer to expose at least a portion of the first layer. The method also includes forming a second layer over the first spacer layer, forming a fill layer on the second layer and filling the first opening, exposing portions of the fill layer to an exposing light as determined by a photomask, and developing the fill layer to remove select portions of the fill layer and leave a portion of the fill layer filling the opening. The second layer conformally coats an interior of the first opening.

An advantage of an embodiment is the reduction in the number of process steps required to fill the via. The reduction in the number of process steps may reduce the manufacturing costs of the product. Furthermore, the reduction in the number of process steps may reduce the occurrence of manufacturing errors, which may increase product yield, further reducing the cost of the product.

A further advantage of an embodiment is that fewer fill materials and process steps may help increase the planarity of the via and the area immediately surrounding the via. For systems that depend on optical reflectivity of structures on the integrated circuit, such as projection display systems that use micro-displays containing filled vias, the increase in planarity may positively impact image quality.

Yet another advantage of an embodiment is the improved structural rigidity of the via with the fill, which may increase the reliability of the via functioning as a mechanical connector.

The foregoing has outlined rather broadly the features and technical advantages of embodiments of the present invention in order that the detailed description of the invention that follows may be better understood. Additional features and advantages of embodiments of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a micro-electro-mechanical system (MEMS) containing positional micromirrors (also referred to as a digital micromirror device (DMD)) that may be used as a spatial light modulator in a projection display system. The invention may also be applied, however, to other integrated circuits wherein there is a desire to fill vias to increase their structural integrity and/or planarity, regardless of whether the vias are used for electrical connectivity or mechanical connectivity.

Figure 1A:
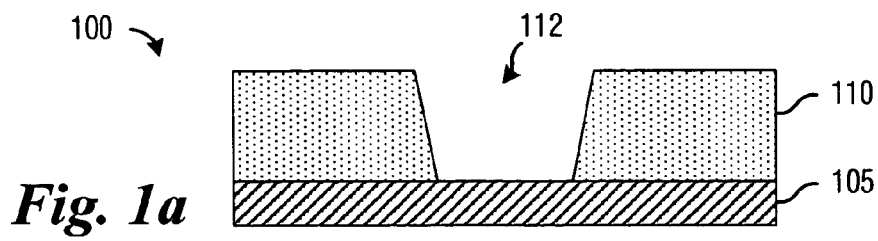
FIGS. 1a through 1f are cross-sectional views of a portion of an integrated circuit at various steps during a process for the filling of a via.

With reference now to FIGS. 1a through 1f, there are shown diagrams of a cross-sectional view of a portion of an integrated circuit 100, illustrating a technique for filling a via. The diagram shown in FIG. 1a illustrates the integrated circuit 100 comprising a first layer 105 and a spacer layer 110. The spacer layer 110 may contain a via 112. The first layer 105 may be a conductive layer, formed from a metallic material or polysilicon, while the spacer layer 110 may be created from a spin-on resist material that may be patterned using standard photo-definable techniques.

Figure 1B:
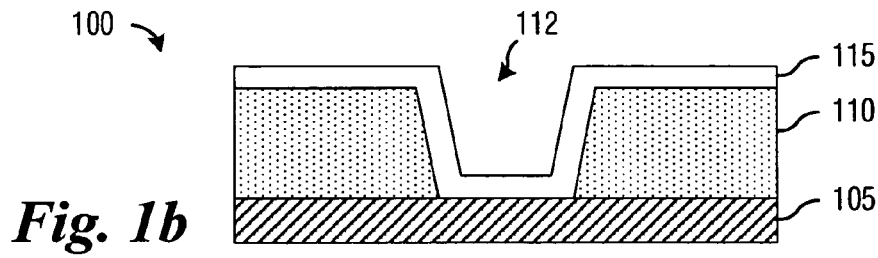

A second layer 115 may be formed over the spacer layer 110 utilizing standard deposition techniques, such as directional and non-directional deposition techniques (including but not limited to evaporation, sputtering, chemical vapor deposition, and so forth). The deposition technique used should provide adequate step coverage to sufficiently coat the walls of the via 112 to afford the desired connectivity, electrical and/or mechanical. The second layer 115 may be formed from a metallic material, such as aluminum, alloys of aluminum, tungsten, alloys of tungsten, titanium, alloys of titanium, and so forth, or silicon, and so on. The diagram shown in FIG. 1b illustrates the integrated circuit 100 after the formation of the second layer 115.

Figure 1C:
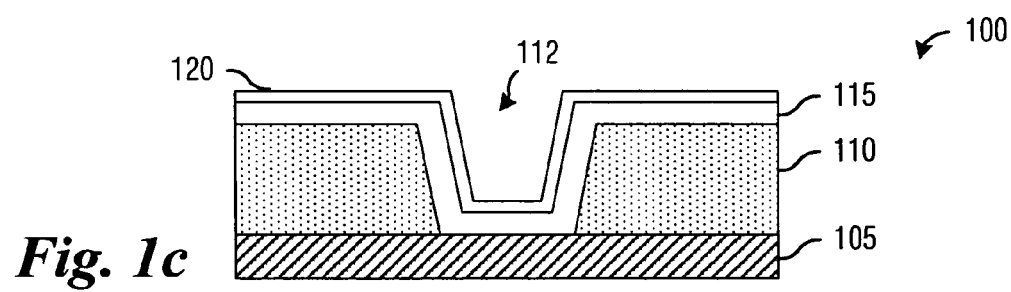
Figure 1D:
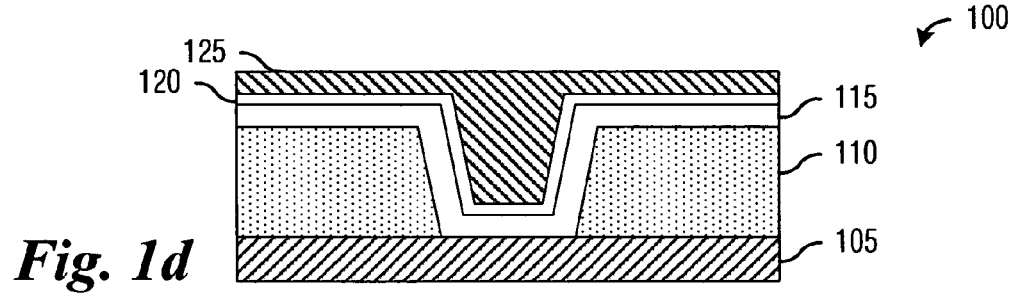

In order to protect the second layer 115 from damage occurring in subsequent process steps, an oxide layer 120 may be formed over the integrated circuit 100 using techniques such as chemical vapor deposition, as shown in FIG. 1c. The via 112 may now be completely filled with the use of a spin-on fill layer 125, as shown in FIG. 1d. The spin-on fill layer 125 may be formed using a spin-on material, such as a spin-on oxide or spin-on polymer. An advantage of using a spin-on material is the material's good fill properties, which may afford a good fill of the via 112. Additionally, the spin-on material may help to planarize the integrated circuit 100. An example of a spin-on material that may be used to form the spin-on fill layer 125 is a backside (or bottom) antireflective coating (BARC), although other oxides and polymers may be used.

Figure 1E:
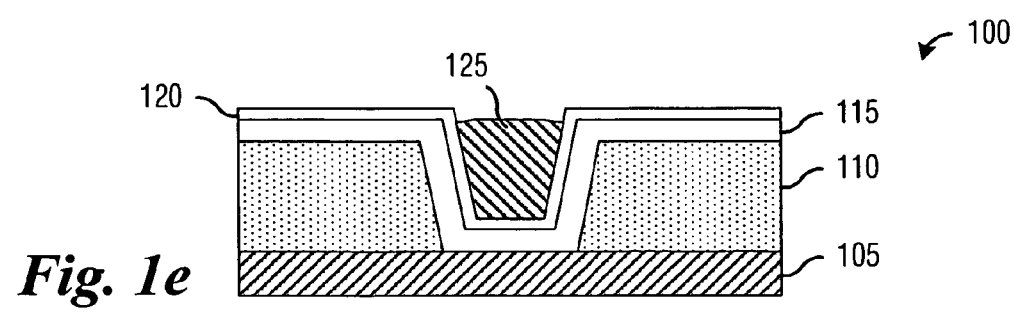
Figure 1F:
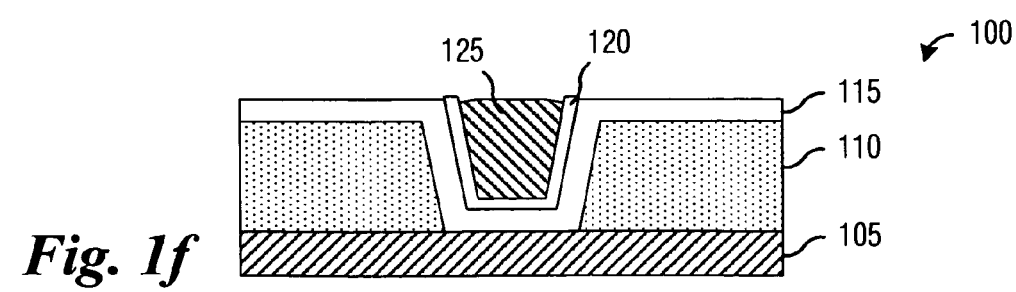

With the spin-on layer 125 cured, either by permitting the spin-on material to dry naturally or with external heating, the BARC may be ashed, wherein the integrated circuit 100 is placed in an ashing chamber and exposed to strong ashing conditions, to remove portions of the spin-on layer 125 deposited on the surface of the oxide layer 120, as shown in FIG. 1e. For example, the ashing may stop when the oxide layer 120 is detected. With the oxide layer 120 as the ashing stop point, the ashing may remove the spin-on fill layer 125 over the majority of the surface of the integrated circuit 100, but leave a majority of the spin-on fill layer 125 in the via 112. The via fill may be completed with an oxide etch of the oxide layer 120 to expose the second layer 115. Since the portions of the oxide layer 120 inside the via 112 are covered by the remnants of the spin-on layer 125, only the exposed parts of the oxide layer 120 may be removed by the oxide etch. FIG. 1f shows the integrated circuit 100 with the via filling complete.

The filling of the via 112 as shown in FIGS. 1a through 1f involves four process steps after the deposition of the second layer 115. Since the manufacturing yield of an integrated circuit may be directly related to the number of process steps that the integrated circuit undergoes, it is desired to reduce the number of process steps as much as possible. Furthermore, some process steps are inherently simpler than others and may be less prone to inducing failures, therefore increasing the manufacturing yield.

With reference now to FIGS. 2a through 2e, there are shown diagrams of a portion of an integrated circuit 200, illustrating a technique for filling a via. The integrated circuit 200, shown in FIGS. 2a through 2e, may be a generic integrated circuit with a portion containing a via being shown in the figures. Alternatively, the integrated circuit 200 may be an implementation of a DMD and a portion shown in the figures may be used to provide connectivity between electrical addressing circuitry located in a first level of the integrated circuit 200 and electrical contacts and conductors in a second level, or in yet another embodiment, the portion shown in the figures may be used to create an individual micromirror of the DMD. The diagrams shown in FIGS. 2a through 2e feature exaggerated layer thicknesses and feature sizes to more clearly illustrate the present invention. The diagrams are not drawn to scale and should not be construed as being limiting to either the scope or the spirit of the present invention.

Figure 2A:
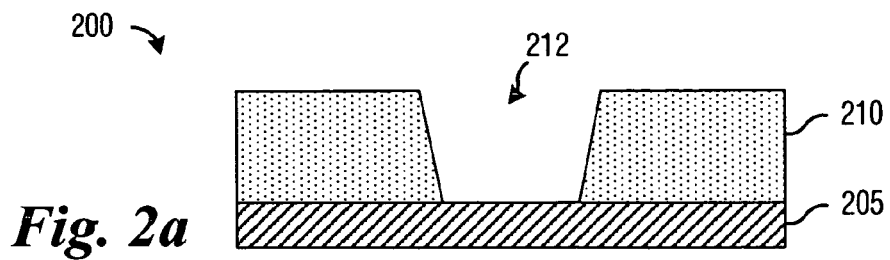
FIGS. 2a through 2e are cross-sectional views of a portion of an integrated circuit at various steps during a process for the filling of a via.

The diagram shown in FIG. 2a illustrates a portion of the integrated circuit 200 comprising a first layer 205 and a spacer layer 210, with the spacer layer 210 containing a via 212. The via 212 may have the rough appearance of a substantially round pillar. The spacer layer 210 may be formed from photo-definable material, such as any of a wide variety of photoresist materials, for example, negative or positive photoresist, and the via 212 may be created using a photo-definition technique, such as by exposing the spacer layer 210 to light from a light source that has been passed through a pattern (a photomask). The light may change the character of the exposed material of the spacer layer 210, making it reactive to a developing solution or impervious to the developing solution, depending on the material of the spacer layer 210. The via 212 may then be created by rinsing the integrated circuit 200 in the developing solution.

Figure 2B:
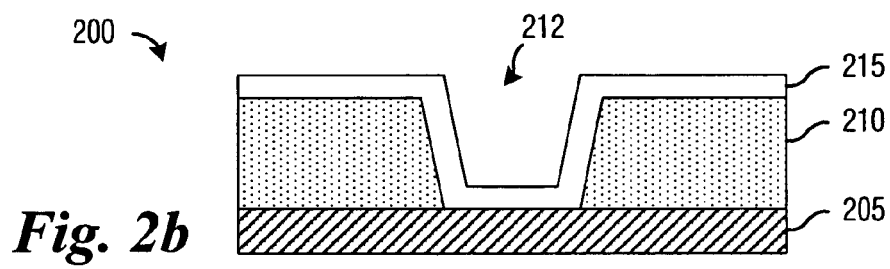

After the via 212 has been created (FIG. 2a), a second layer 215 may be formed over the spacer layer 210 utilizing standard deposition techniques, such as directional and non-directional deposition techniques (including but not limited to evaporation, sputtering, chemical vapor deposition, and so forth). The deposition technique used should provide adequate step coverage to sufficiently coat the walls of the via 212 to afford the desired connectivity, electrical and/or mechanical. The second layer 215 may be formed from a metallic material, such as aluminum, alloys of aluminum, tungsten, alloys of tungsten, titanium, alloys of titanium, and so forth, or silicon, and so on. The second layer 215 may or may not be made from the same material as was used to make the first layer 205. The diagram shown in FIG. 2b illustrates the integrated circuit 200 with the second layer 215.

Figure 2C:
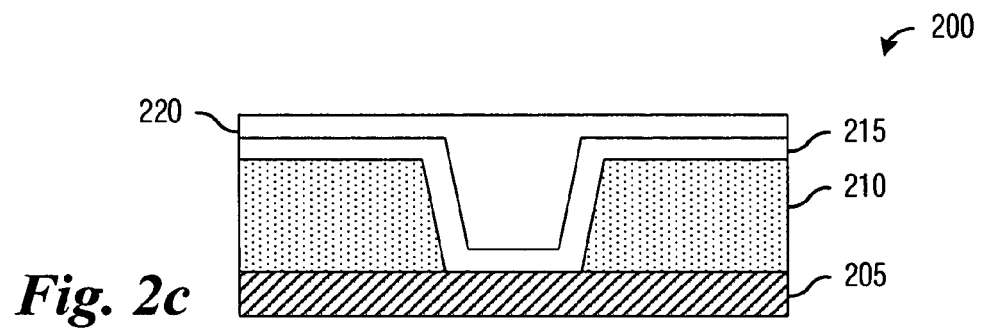

After the second layer 215 has been formed, a fill layer 220 may be formed on the surface of the integrated circuit 200, as shown in FIG. 2c. The fill layer 220 may be formed to a target thickness of about 4400 Angstroms. The fill layer 220 not only coats the surface of the integrated circuit 200, planarizing it, but the fill layer 220 may also fill remaining open spaces in the via 212 after the walls of the via 212 have been coated by the second layer 215. Preferably, the fill layer 220 may be formed from a photo-definable spin-on oxide, such as PUMA™ from Dow Corning. PUMA™ is also referred to as DD-5201. Desirable properties of PUMA™ may include its low cure temperature (compared to other photo-definable spin-on oxides) and high thermal stability, which may help maintain the structural stability of the via 212 in subsequent process steps.

Alternatively, in place of the fill layer 220 formed from the photo-definable oxide, the fill layer 220 may be formed from one of a wide variety of photo-definable polymers or photo-definable amorphous metal oxides. An advantage of using a photo-definable oxide, photo-definable polymer, or photo-definable amorphous metal oxide to form the fill layer 220 is that it is not necessary to use a photoresist, develop, and etch process cycle to create desired patterns and structures in the fill layer 220. The elimination of the photoresist, develop, and etch process cycle may reduce the number of manufacturing process steps by one-third, thereby potentially reducing the number of manufacturing defects arising from the additional process steps that may reduce the manufacturing yield.

Once the fill layer 220 has been applied over the integrated circuit 200, portions of the fill layer 220 may be exposed to a light, such as an ultraviolet light, which may change the nature of the exposed material making up the fill layer 220 and either making the material susceptible or impervious to a solvent used to remove the fill layer 220. Prior to the exposure to the ultraviolet light, the integrated circuit 200 may undergo a pre-exposure bake at approximately 120 degrees Celsius for about 150 seconds. The pre-exposure bake may help to evaporate a portion of the material used in the fill layer 220.

Figure 2D:
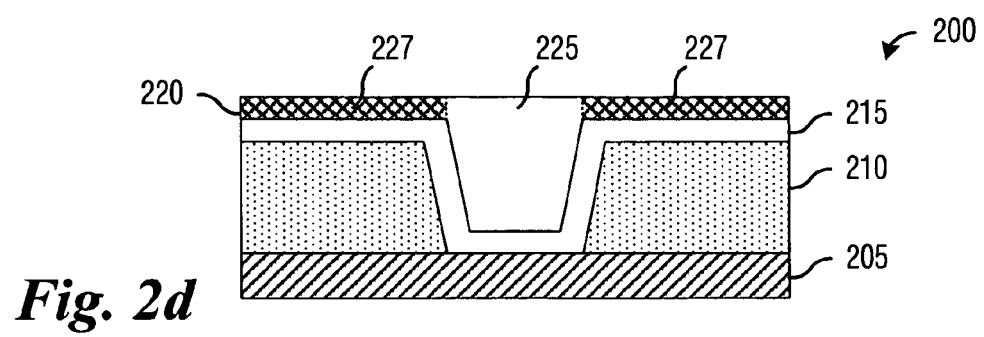

Preferably, the fill layer 220 may then be exposed to an ultraviolet light with a wavelength of about 365 nm as produced by a mercury arc lamp, for example, energized at approximately 4600 MJoules. For example, as shown in FIG. 2d, a first portion 227 of the fill layer 220 has not been exposed to the light, while a second portion 225 of the fill layer 220 has been exposed to the light. After exposure to the ultraviolet light, the integrated circuit 200 may undergo a post-exposure bake at approximately 120 degrees Celsius for about 240 seconds. The post-exposure bake may help ensure the evaporation of additional solvents that may remain in the fill layer 220. Furthermore, the post-exposure bake may help to complete the cross-linking of the portions of the fill layer 220 exposed to the light.

Figure 2E:
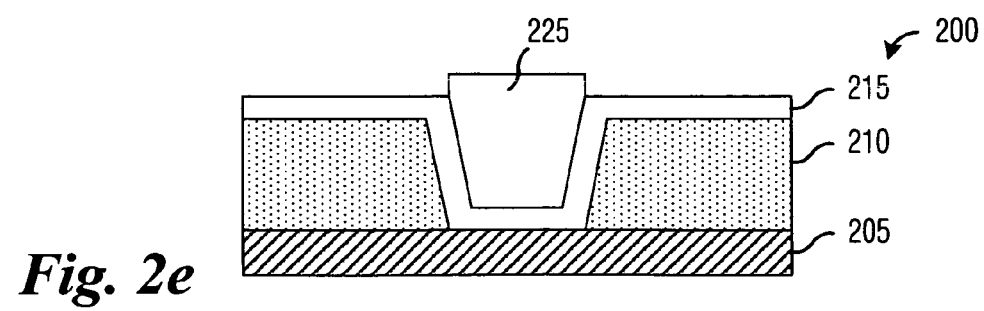

Exposure to the light has made the second portion 225 of the fill layer 220 insoluble to the solvent used to remove the fill layer 220, and after rinsing the integrated circuit 200 in the solvent, the second portion 227 of the fill layer 220 is removed, leaving the first portion 225 of the fill layer 220 in place, as shown in FIG. 2e. An example of a preferred solvent may be mesitylene, an organic solvent. Mesitylene is also commonly referred to as 1,3,5-trimethyl benzene, Mesitelene, Mesitileno, or Mésitylène. Although the fill layer 220 is described above as being a negative imaging process, the use of a positive imaging process may be possible with the use of other forms of photo definable oxides and solvents. As discussed previously, the thickness of the fill layer 220, and therefore the percentage of the first portion 225 of the fill layer 220 extending above the second layer 215, as shown in FIG. 2e is exaggerated for illustration and discussion purposes.

After developing with mesitylene, the integrated circuit 200 may undergo a post-develop bake at approximately 100 degrees Celsius for about 100 seconds. The post-develop bake may help to evaporate off any remaining solvents on the integrated circuit 200 or remaining in the integrated circuit 200, such as in portions of the fill layer 220 remaining in the via 212.

Figure 3:
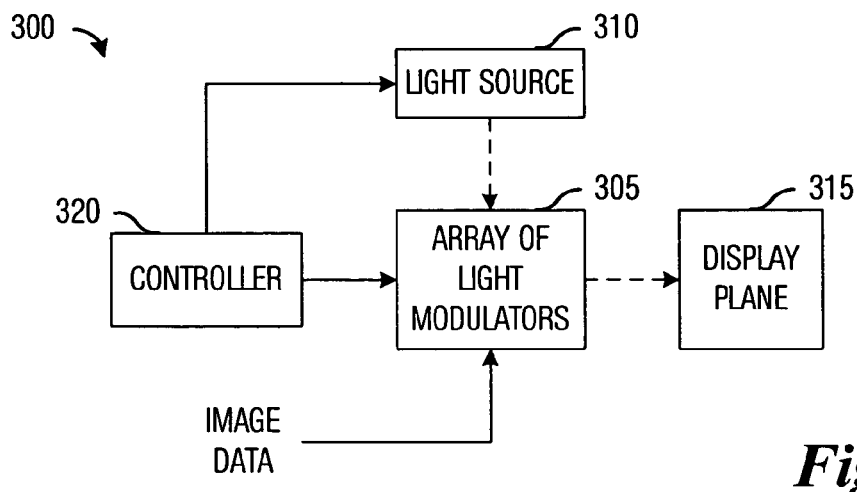
FIG. 3 is a block diagram of a display system.

With reference now to FIG. 3, there is shown a diagram illustrating a display system 300, wherein the display system 300 makes use of a microdisplay containing filled vias. The display system 300 utilizes a spatial light modulator, more specifically, an array of light modulators 305, wherein individual light modulators in the array of light modulators 305 assume a state corresponding to image data for an image being displayed by the display system 300. The array of light modulators 305 is preferably a digital micromirror device (DMD) with each light modulator being a positional micromirror. Light from a light source 310 may be reflected away from or towards a display plane 315, depending on image data corresponding to each micromirror. A combination of the reflected light from all of the light modulators in the array of light modulators 305 produces an image corresponding to the image data. A sequence controller 320 coordinates the loading of the image data into the array of light modulators 305, controls the light source 310, and so forth.

Figure 4A:
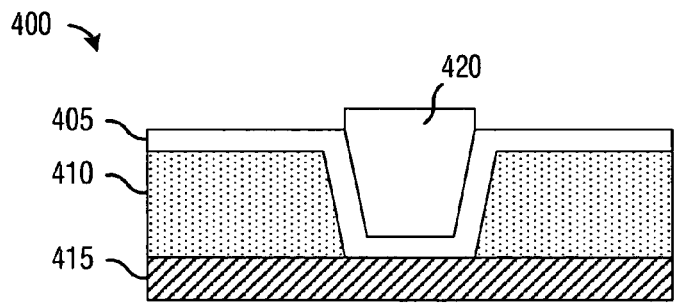
FIGS. 4a through 4c are cross-sectional views of a DMD.

The array of light modulators 305 may be integrated into a single integrated circuit (for display systems utilizing single-chip microdisplays), with the light modulators arranged in arrays, for example, a rectangular array or a diamond array arrangement. The integrated circuit may include at least two distinct layers containing vias, with the vias being preferably filled to provide additional structural rigidity. A first layer containing vias may be a hinge and hinge support layer and may be formed from a metal material, including, but not limited to metals such as aluminum, tungsten, titanium, and alloys thereof. The hinge permits the micromirrors of the DMD to pivot and to change state, while the hinge supports elevate the hinge, permitting the micromirrors to move. A diagram shown in FIG. 4a illustrates an integrated circuit 400 with the first layer of the array of light modulators 305 shown as a first layer 405. As discussed previously, the first layer 405 may be formed by deposition over a spacer layer 410, which in turn, was formed over a second layer 415. In the integrated circuit 400, the second layer 415 may include electrical addressing circuitry and electrical conductors. Vias in the first layer 405 may be filled, for example, by a filler 420.

Figure 4B:
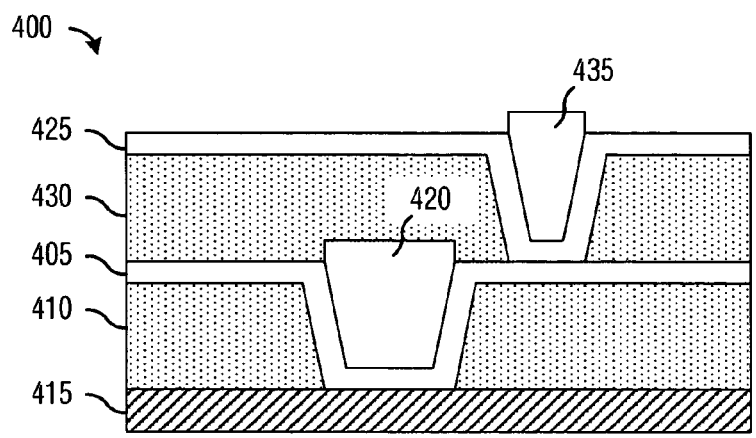
Figure 4C:
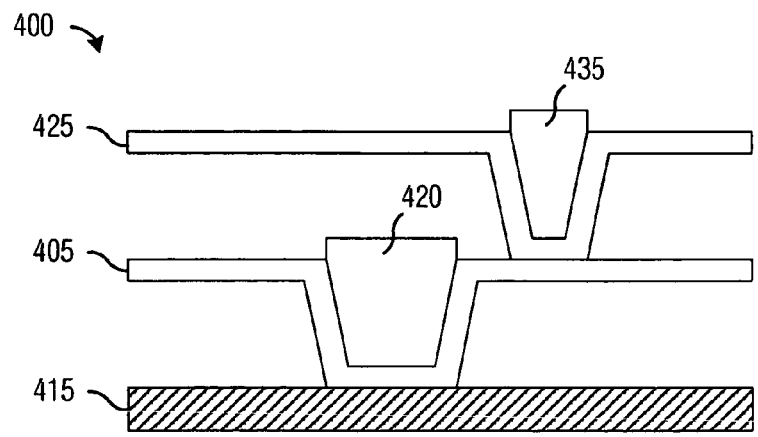

A second layer of the integrated circuit containing vias may be a mirror layer and may be formed from a metal material, including, but not limited to metals such as aluminum, tungsten, titanium, and alloys thereof. A diagram shown in FIG. 4b illustrates the integrated circuit 400 with the second layer of the array of light modulators containing vias shown as a third layer 425 formed above the first layer of the integrated circuit containing vias. The third layer 425 may be formed by deposition over a second spacer layer 430, which was formed over the first layer 405. Vias in the third layer 425 may allow the attachment of the micromirrors to the hinges in the first layer 405. As with the vias in the first layer 405, the vias in the third layer may be filled, for example, by a filler 435. Not only does the filler 435 improve the structural rigidity, the filler 435 may help to improve the reflectivity of the mirror layer by reducing light scatter resulting from light entering the vias. After the completion of the filling of the vias in the third layer 425, the spacer layer 410 and the second spacer layer 430 may be removed using an isotropic etch. The removal of the spacer layer 410 and the second spacer layer 430 may permit the micromirrors to pivot freely about the hinges in the first layer 405.

Figure 5:
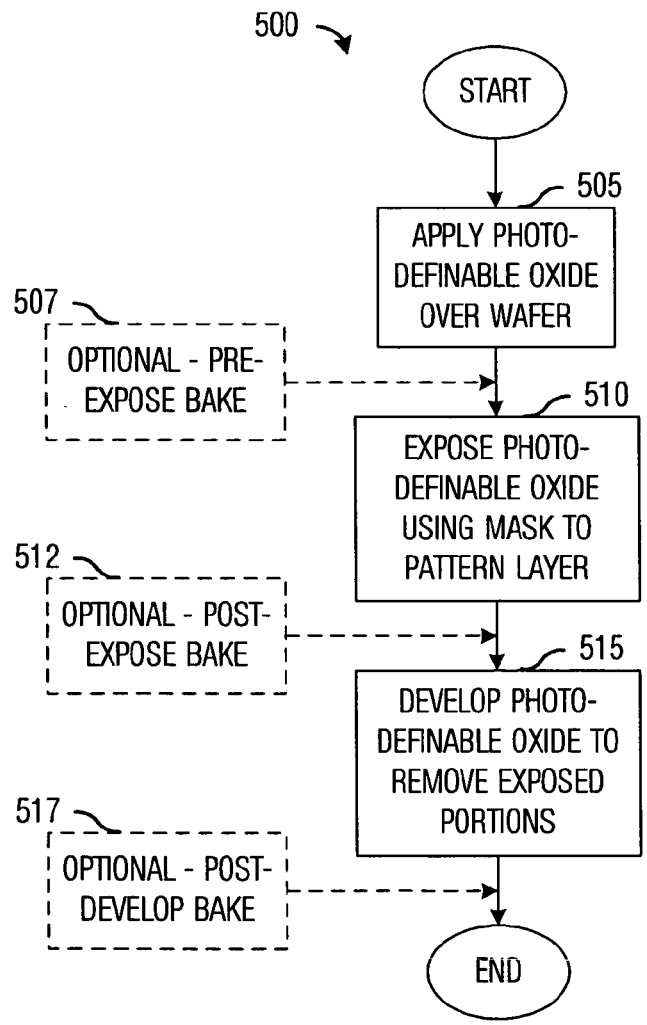
FIG. 5 is a flowchart of steps performed in the filling of a via.

With reference now to FIG. 5, there is shown a diagram illustrating a sequence of events 500 in the filling of a via in an integrated circuit, according to a preferred embodiment of the present invention. The filling of a via may initiate after the via has been formed in the layer(s) of the integrated circuit, as needed, and a conformal material has been deposited on the walls of the via. Prior to the formation of the via, a first layer was formed over a substrate and then a spacer layer was deposited on the first spacer layer. The via can then be formed in the spacer layer.

The filling of the via may begin with the application of a photo-definable oxide over the integrated circuit (block 505), with the application being preferably achieved using a spin-on coating technique. The application of the photo-definable oxide may have a target thickness of about 4400 Angstroms. The use of a spin-on photo-definable oxide material, such as PUMA™ from Dow Corning, is preferred because of its good fill properties, low cure temperature, and good thermal stability. Additionally, the spin-on photo-definable oxide has good planarization properties. Alternatively, a spin-on photo-definable polymer or spin-on amorphous metal oxide may be used.

After the photo-definable oxide fill material has been applied, an optional pre-expose bake at approximately 120 degrees Celsius for about 150 seconds may be applied to the integrated circuit (block 507). The pre-expose bake may help to at least partially cure the fill material by evaporating at least some of the solvents present in the fill material. After the application of the fill material and the optional pre-expose bake, the photo-definable oxide fill material may be patterned by being exposed to a light from a light source, with the light passing through a mask (block 510). The exposure to the light may change the character of the photo-definable oxide fill material, either making it susceptible or impervious to a solvent used to develop (remove) the photo-definable oxide fill material. The light used in the patterning of the photo-definable oxide fill material may depend on the material itself. For example, with the spin-on photo-definable oxide, an ultraviolet light with a wavelength of about 365 nm (I-line) produced by a mercury arc lamp excited with about 4600 MJoules of energy may be used to expose the fill material.

After exposure to the light to define portions of the photo-definable oxide fill material to keep and portions to remove (block 510), an optional post-expose bake at approximately 120 degrees Celsius for about 240 seconds may be applied (block 512). The post-expose bake may help to finalize any cross linking initiated but not completed by the exposure to the ultraviolet light. Furthermore, the post-expose bake may also help to evaporate remaining solvents present in the fill material. After the exposure to the light and the optional post-expose bake, the photo-definable oxide fill material may be developed using a solvent, such as mesitylene, an organic solvent (block 515). Mesitylene is also commonly referred to as 1,3,5-trimethyl benzene, Mesitelene, Mesitileno, or Mésitylène. Depending on the fill material, other solvents may be used. The solvent may remove the unwanted portions of the photo-definable oxide fill material, leaving the photo-definable oxide fill material in the via of the integrated circuit.

After the unwanted portions of the photo-definable oxide fill material has been removed, the fabrication of the integrated circuit may continue with an optional post-develop bake at approximately 100 degrees Celsius for about 100 seconds (block 517). The post-develop bake may help to evaporate off remaining solvents on the integrated circuit, such as the developing solvent (for example, mesitylene) or solvents remaining in the integrated circuit, such as in portions of the fill layer remaining in the vias. After the post-develop bake, the fabrication of the integrated circuit may continue to completion.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a spacer layer on a substrate;
   forming a via having walls and a bottom in the spacer layer;
   depositing a conformal conductive layer on the spacer layer and on the walls and bottom of the via;
   spinning-on a photo-definable oxide material on the conductive layer, forming a fill layer on the conductive layer and filling the via;
   exposing portions of the fill layer to an exposing light using a photomask;
   developing the fill layer to remove select portions of the fill layer and leave a portion of the fill layer filling the via; and
   removing the spacer layer.

2. The method of claim 1, wherein the developing of the fill layer further comprises etching portions of the conductive layer before removing the spacer layer.

3. The method of claim 1, wherein the fill layer comprises a spin-on photo-definable metal oxide.

4. The method of claim 1, further comprising depositing a conformal dielectric layer on the conductive layer before the spinning-on of the photo-definable oxide material.

5. The method of claim 1, further comprising:
after the forming, curing the fill layer with a first bake; and
after the exposing, curing the fill layer with a second bake.

6. The method of claim 1, wherein the fill layer is about 4400 Angstroms thick.

7. The method of claim 2, wherein the developing comprises rinsing the exposed fill layer with mesitylene.

8. The method of claim 5, further comprising, after the developing, curing the fill layer with a third bake.

9. A semiconductor device comprising:
a first conductive layer disposed above a substrate;
a set of first conductive supports disposed on the first layer, wherein each of the first supports comprises a circumferential pillar of conductive material and a fill layer of spin-on photo-definable oxide material filling an inside of the pillar; and
a second conductive layer disposed on the first supports above the first layer, wherein portions of the second layer not overlying the first supports are separated from the first layer by a vacuum or a gas.

10. The semiconductor device of claim 9, wherein the first conductive layer and the second conductive layer each comprise a metallic material.

11. The semiconductor device of claim 9, wherein the set of first supports are disposed on the first conductive layer in a rectangular array pattern or a diamond array pattern.

12. The semiconductor device of claim 9, further comprising electrical circuitry disposed in the substrate and electrically connected to the first conductive layer.

13. The semiconductor device of claim 9, further comprising:
a set of second conductive supports disposed on the second conductive layer, wherein each of the second conductive supports comprises a circumferential pillar of conductive material and a fill layer of photo-definable dielectric material filling an inside of the pillar; and
a third conductive layer disposed on the second conductive supports above the second conductive layer, wherein portions of the third conductive layer not overlying the second conductive supports are separated from the second layer by a vacuum or a gas.

14. The semiconductor device of claim 9, wherein the semiconductor device comprises a digital micromirror device.

15. The semiconductor device of claim 13, wherein the third conductive layer comprises movable structures, wherein each movable structure is connected to the second layer by a respective one of the second conductive supports, and wherein each movable structure pivots about an axis.

16. The semiconductor device of claim 13, wherein each of the second conductive supports is offset from a respective one of the first supports.

17. A method for fabricating a semiconductor device, the method comprising:
forming a first layer over a substrate;
depositing a first spacer layer on the first layer;
creating a first opening in the first spacer layer to expose at least a portion of the first layer;
forming a second layer over the first spacer layer, conformally coating an interior of the first opening;
forming a fill layer comprised of a spin-on oxide on the second layer and filling the first opening;
exposing portions of the fill layer to an exposing light as determined by a photomask; and
developing the fill layer to remove select portions of the fill layer and leave a portion of the fill layer filling the opening.

18. The method of claim 17, further comprising, after the developing:
forming a second spacer layer on the second layer;
creating a second opening in the second spacer layer to expose at least a portion of the second layer;
forming a third layer over the second spacer layer, conformally coating an interior of the second opening;
forming a second fill layer on the third layer and filling the second opening;
exposing portions of the second fill layer to an exposing light as determined by a second photomask; and
developing the second fill layer to remove unwanted portions of the second fill layer and leave a portion of the fill layer filling the second opening.

19. The method of claim 18, further comprising, after the second developing, etching away the first spacer layer and the second spacer layer.

* * * * *